(12) United States Patent
Yen et al.

(10) Patent No.: US 8,420,420 B2
(45) Date of Patent: Apr. 16, 2013

(54) METHOD OF MANUFACTURING THIN FILM TRANSISTOR ARRAY SUBSTRATE AND STRUCTURE THEREOF

(75) Inventors: Wei-pang Yen, Daxi Township (TW);
Hsien-kun Chiu, Taoyuan (TW);
Chan-chang Liao, Zhonghe (TW);
Chao-huan Hsu, Guishan Township (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 165 days.

(21) Appl. No.: 13/113,033

(22) Filed: May 21, 2011

(65) Prior Publication Data
US 2012/0261666 A1    Oct. 18, 2012

(30) Foreign Application Priority Data

Apr. 15, 2011    (TW) .............................. 100113244 A (51) Int. Cl.
*H01L 21/00*    (2006.01)
(52) U.S. Cl.
USPC ............... 438/34; 438/39; 438/30; 438/158; 257/59; 257/E21.411; 257/E29.273

(58) Field of Classification Search ................. 438/34, 438/39, 158, 30; 257/59, E21.411, E29.273
See application file for complete search history.

(56) References Cited

U.S. PATENT DOCUMENTS

| | | | |
|---|---|---|---|
| 6,255,130 B1 * | 7/2001 | Kim | ................................. 438/30 |
| 6,537,840 B2 | 3/2003 | Tseng | |
| 7,005,331 B2 | 2/2006 | Chen | |
| 7,016,007 B2 | 3/2006 | Chang et al. | |

FOREIGN PATENT DOCUMENTS

| | | |
|---|---|---|
| CN | 101170085 A | 4/2008 |
| TW | I325612 | 6/2010 |

\* cited by examiner

*Primary Examiner* — Thinh T Nguyen
(74) *Attorney, Agent, or Firm* — Cheng-Ju Chiang (57) ABSTRACT

A method of manufacturing a thin film transistor array substrate and a structure of the same are disclosed. The manufacturing method merely requires two steps of mask fabrication to accomplish the manufacture of thin film transistor array, in which the manufacturing method utilizes a first mask fabrication step to define a pattern of a source electrode and a drain electrode of the thin film transistor, and a partially-exposed dielectric layer, and utilizes a second mask fabrication step to define an arrangement of a transparent conductive layer. The manufacturing method and structure can dramatically reduce the manufacturing cost of masks and simplify the whole manufacturing process.

8 Claims, 8 Drawing Sheets

METHOD OF MANUFACTURING THIN FILM TRANSISTOR ARRAY SUBSTRATE AND STRUCTURE THEREOF

TECHNICAL FIELD OF THE INVENTION

The present invention relates to a method of manufacturing a thin film transistor array substrate and a structure of the same, and more particularly, to a thin film transistor array substrate manufacturing method requiring merely two steps of mask fabrication, and a structure of a thin film transistor array substrate using a transparent conductive layer as a conducting wire for an electrical connection.

BACKGROUND OF THE INVENTION

Generally speaking, a thin-film transistor liquid crystal display (TFT-LCD) is manufactured mainly in three processing parts, including a thin-film transistor array engineering, a cell engineering, and a module engineering. Among which, the thin-film transistor array engineering is by forming an array-shaped thin-film transistor circuit onto a glass substrate.

A conventional thin-film transistor circuit is fabricated in five steps of mask fabrication with five masks. As the requirements of large-sized flat panel displays grow, masks utilized for manufacturing the large-sized flat panel displays have to be enlarged accordingly. Therefore, it is difficult to lower the cost for fabricating the large-sized flat panel displays subjected to the quantity and cost of the masks. Moreover, each mask fabrication step may spend more time in photoresist-coating, soft bake, hard bake, exposure, developing, etching, and photoresist removal.

Therefore, reducing the number of masks and steps of mask fabrication is an important aspect in this industry.

SUMMARY OF THE INVENTION

An objective of the present invention is to provide a method of manufacturing a thin film transistor array substrate and a structure of the same, for reducing steps of mask fabrication and the number of masks, and simplifying the process to manufacture the thin film transistor array substrate.

To achieve the above objective, the present invention provides a method of manufacturing a thin film transistor array substrate, comprising steps of: providing a substrate and sequentially stacking a first metal layer, a dielectric layer, a semiconductor layer, and a second metal layer on the substrate; forming a first patterned photoresist on the second metal layer; patterning the first metal layer, the dielectric layer, the semiconductor layer, and the second metal layer by using the first patterned photoresist to partially expose a surface of the dielectric layer, to form a source electrode and a drain electrode by the second metal layer, and to define a channel between the source electrode and the drain electrode; forming a protective layer to cover the source electrode, the drain electrode, the channel, and the partially-exposed surface of the dielectric layer; forming a second patterned photoresist on the protective layer; patterning the first metal layer, the dielectric layer, the semiconductor layer, the second metal layer, and the protective layer by using the second patterned photoresist to expose surfaces of the source electrode and the drain electrode, and a surface of the protective layer corresponding to the lower partially-exposed dielectric layer; forming a transparent conductive layer to cover the surfaces of the source electrode and the drain electrode, the surface of the protective layer corresponding to the lower partially-exposed dielectric layer, and the remaining second patterned photoresist; and removing the remaining second patterned photoresist and the transparent conductive layer covering the remaining second patterned photoresist altogether.

In another aspect, the present invention provides a method of manufacturing a thin film transistor array substrate, comprising steps of: providing a substrate and sequentially stacking a first metal layer, a dielectric layer, a semiconductor layer, and a second metal layer on the substrate; forming a first patterned photoresist on the second metal layer, the first patterned photoresist comprising a first region, a second region, and a third region disposed on two sides of the second region, wherein a thickness of the first region is smaller than that of the second region and a thickness of the second region is smaller than that of the third region; conducting a first ashing process until the first region of the first patterned photoresist is removed; removing the second metal layer and the semiconductor layer corresponding to the first region to partially expose a surface of the dielectric layer; conducting a second ashing process until the second region of the first patterned photoresist is removed; removing the second metal layer corresponding to the second region, wherein the second metal layer corresponding to the third region respectively forms a source electrode and a drain electrode and a channel is formed between the source electrode and the drain electrode; removing the first patterned photoresist corresponding to the third region; forming a protective layer to cover the source electrode, the drain electrode, the channel, and the partially-exposed surface of the dielectric layer; forming a second patterned photoresist, the second patterned photoresist exposing the protective layer above the source electrode and the drain electrode, the second patterned photoresist comprising a first portion corresponding to the partially-exposed surface of the dielectric layer covered by the protective layer and a second portion corresponding to the channel, wherein a thickness of the first portion is smaller than that of the second portion; removing the protective layer above the source electrode and the drain electrode to expose surfaces of the source electrode and the drain electrode; conducting a third ashing process until the first portion of the second patterned photoresist is removed, to expose a surface of the protective layer corresponding to the lower partially-exposed dielectric layer; forming a transparent conductive layer to cover the surfaces of the source electrode and the drain electrode, the surface of the protective layer corresponding to the lower partially-exposed dielectric layer, and the remaining second patterned photoresist; and conducting a lift-off process to remove the remaining second patterned photoresist and the transparent conductive layer thereon.

In still another aspect, the present invention provides a structure of a thin film transistor array substrate, comprising: a first metal layer forming a first electrode of the thin film transistor; a dielectric layer formed on the first metal layer; a semiconductor layer formed on the dielectric layer, the semiconductor layer comprising an amorphous silicon layer and an ohmic contact layer; a second metal layer disposed on the ohmic contact layer, the second metal layer having two portions which respectively form a second electrode and a third electrode of the thin film transistor and the ohmic contact layer also having two portions corresponding to the second electrode and the third electrode such that the semiconductor layer forms a channel between the second electrode and the third electrode; a protective layer covering the channel and exposing the second electrode and the third electrode; and a transparent conductive layer separately formed on the second electrode and the third electrode respectively, the transparent conductive layer extending out from the second electrode along a surface of the protective layer and the transparent conductive layer extending from the third electrode to a metal contact of another thin film transistor.

The thin film transistor array substrate manufacturing method of the present invention merely requires two steps of mask fabrication to accomplish the manufacture of thin film transistor array. Compared to the conventional manufacturing manner, the present invention is able to dramatically reduce the manufacturing cost of masks and simplify the whole manufacturing process. Moreover, the transparent conductive layer of the thin film transistor array substrate of the present invention not merely can serve as a pixel electrode of the thin film transistor, but also can be used as a conducting wire for an electrical connection.

BRIEF DESCRIPTION OF THE DRAWINGS

The present invention will be described in details in conjunction with the appending drawings.

DETAILED DESCRIPTION OF THE INVENTION

The thin film transistor array substrate manufacturing method of the present invention merely requires two steps of mask fabrication to accomplish the manufacture of thin film transistor array. The present invention utilizes a first mask fabrication step to define a pattern of a source electrode and a drain electrode of the thin film transistor, and a partially-exposed dielectric layer, and utilizes a second mask fabrication step to define an arrangement of a transparent conductive layer, as described below.

Figure 1A:
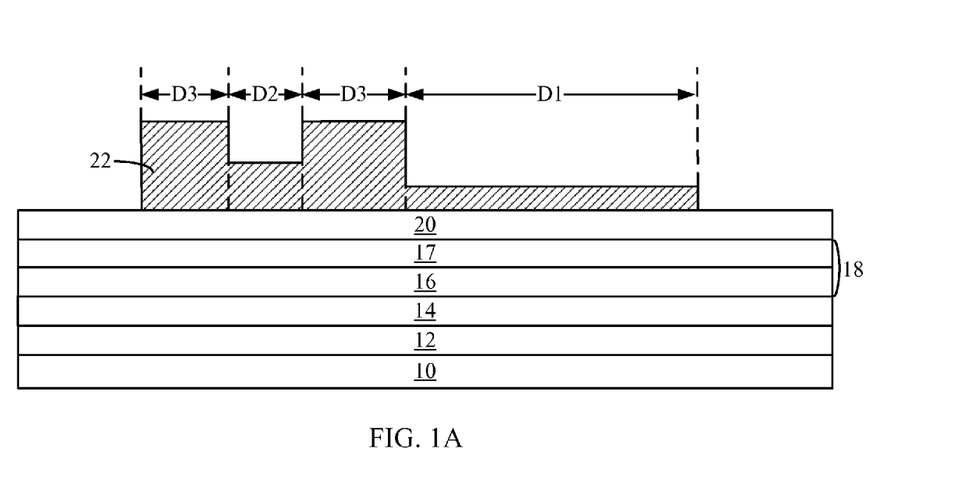
FIGS. 1A to 1G are schematic diagrams illustrating a thin film transistor array substrate manufacturing method utilizing a first mask fabrication step according to the present invention.

FIGS. 1A to 1G are schematic diagrams illustrating the thin film transistor array substrate manufacturing method utilizing a first mask fabrication step according to the present invention. Referring to FIG. 1A, a substrate 10 is provided at first. Then, a first metal layer 12, a dielectric layer 14, a semiconductor layer 18, and a second metal layer 20 are sequentially stacked on the substrate 10. The semiconductor layer 18 may include an amorphous silicon layer 16 and an ohmic contact layer 17. The substrate 10 can be a glass substrate, a plastic substrate, or a flexible substrate. The dielectric layer 14 can be a silicon oxide layer, a silicon nitride layer, or a combination made from aforesaid materials. The ohmic contact layer 17 can be a heavily-doped amorphous silicon layer. The first metal layer 12 and the second metal layer 20 may be made of different metals such as aluminum, molybdenum, titanium, chromium, and copper; nitrides of afore-mentioned metals such as titanium nitrides; or alloys made of the metals described above, or other conductive materials.

As indicated in FIG. 1A, a first patterned photoresist 22 is provided on the second metal layer 20 after the second metal layer 20 is formed. The first patterned photoresist 22 may be formed by performing a first photolithographic step with a half-tone mask (not shown). By utilizing different light transmittance in different portions of the half-tone mask in an exposure procedure, the first patterned photoresist 22 will be formed with a thickness varied in different regions. As shown in FIG. 1A, the first patterned photoresist 22 includes a first region D1, a second region D2, and a third region D3 disposed on two sides of the second region D2, wherein a thickness of the first region D1 is smaller than that of the second region D2 and a thickness of the second region D2 is smaller than that of the third region D3. The third region D3 is used to define a pattern of a source electrode and a drain electrode of the thin film transistor; the second region D2 is used to define a channel below the source electrode and the drain electrode; and the first region D1 is used to expose a part of the dielectric layer 14, as described below.

Figure 1B:
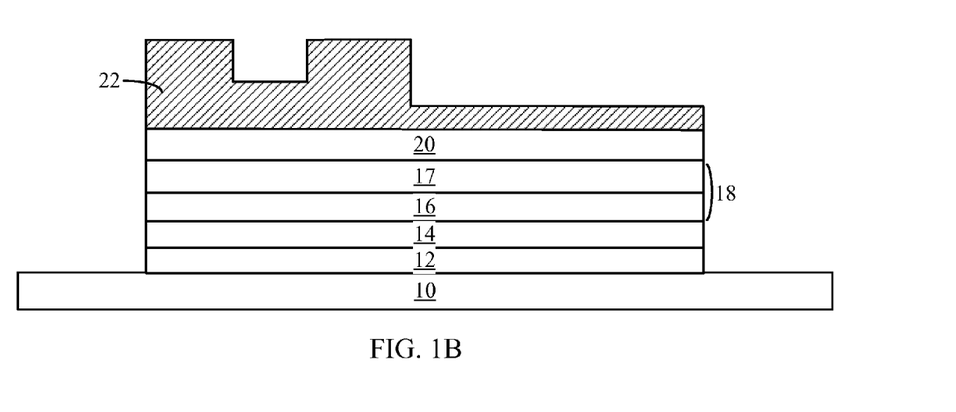

Referring to FIG. 1B, an etching process is performed and the first patterned photoresist 22 serves as an etching mask to remove the second metal layer 20, the semiconductor layer 18, the dielectric layer 14, and the first metal layer 12 not covered by the first patterned photoresist 22.

Figure 1C:
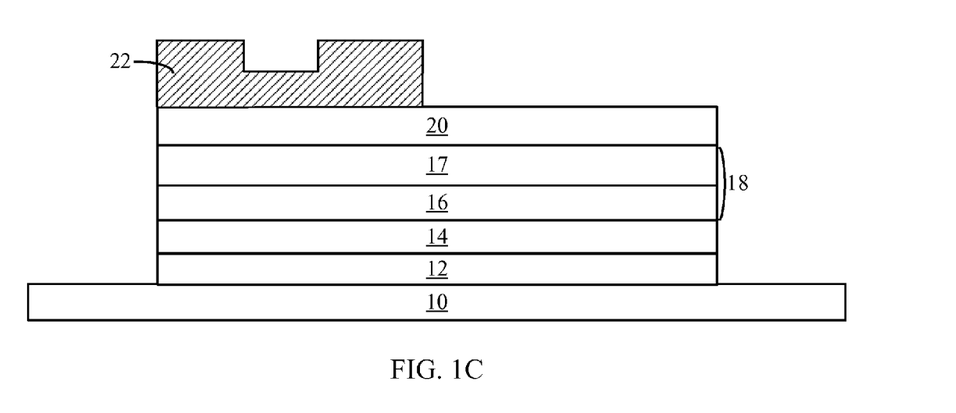

Referring to FIG. 1C, a first ashing process is conducted by introducing oxygen to reduce the thickness of the first patterned photoresist 22 until the first region D1 is completely removed. In the meanwhile, the thickness of the second region D2 and the third region D3 will be reduced but still maintain a certain thickness.

Figure 1D:
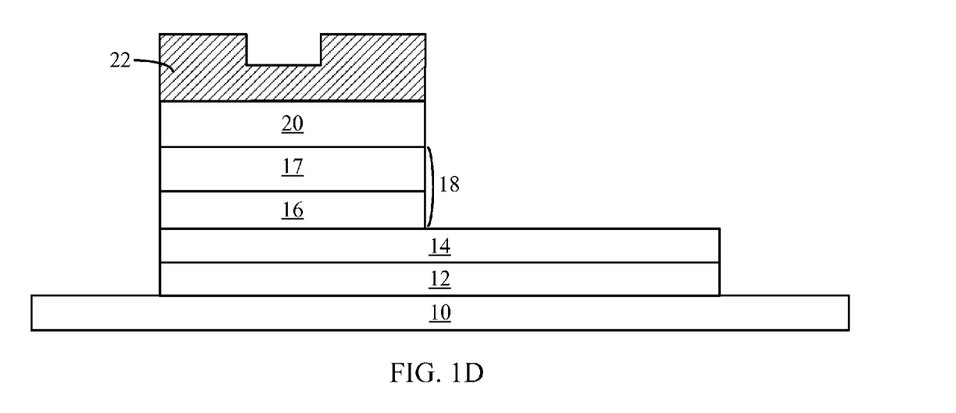

Referring to FIG. 1D, an etching process is performed and the second region D2 and the third region D3 of the first patterned photoresist 22 serve as an etching mask to remove the second metal layer 20 and the semiconductor layer 18 corresponding to the first region D1 to partially expose a surface of the dielectric layer 14.

Figure 1E:
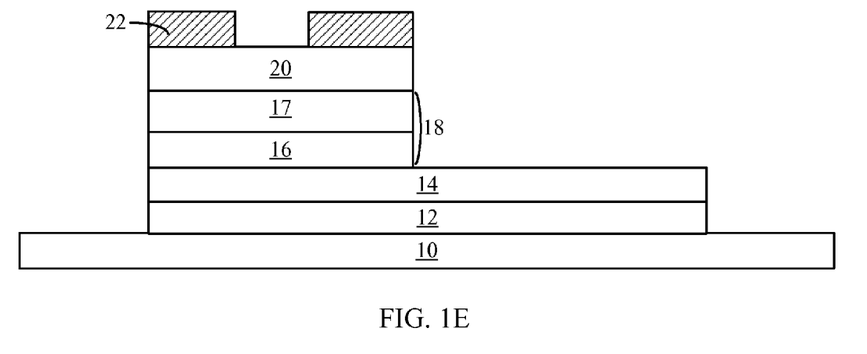

Referring to FIG. 1E, a second ashing process is conducted until the second region D2 of the first patterned photoresist 22 is removed. In the meanwhile, the thickness of the third region D3 will be reduced but still maintain a certain thickness.

Figure 1F:
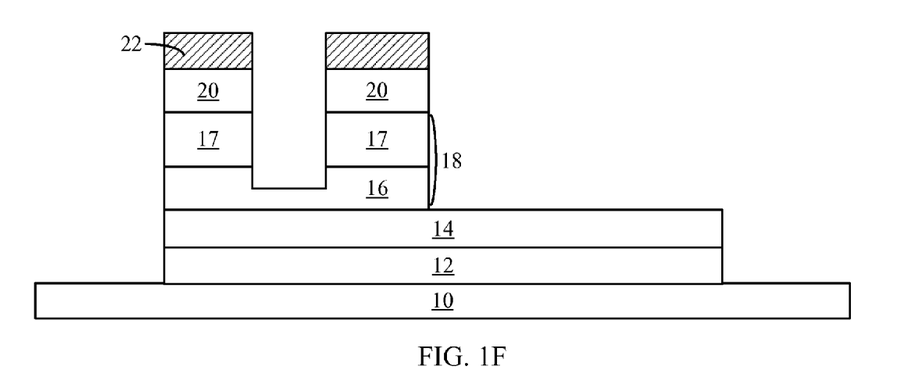

Referring to FIG. 1F, an etching process is performed and the third region D3 of the first patterned photoresist 22 serves as an etching mask to remove the second metal layer 20 and a part of the semiconductor layer 18 corresponding to the second region D2. In this embodiment, the ohmic contact layer 17 and a part of the amorphous silicon layer 16 corresponding to the second region D2 are removed.

Figure 1G:
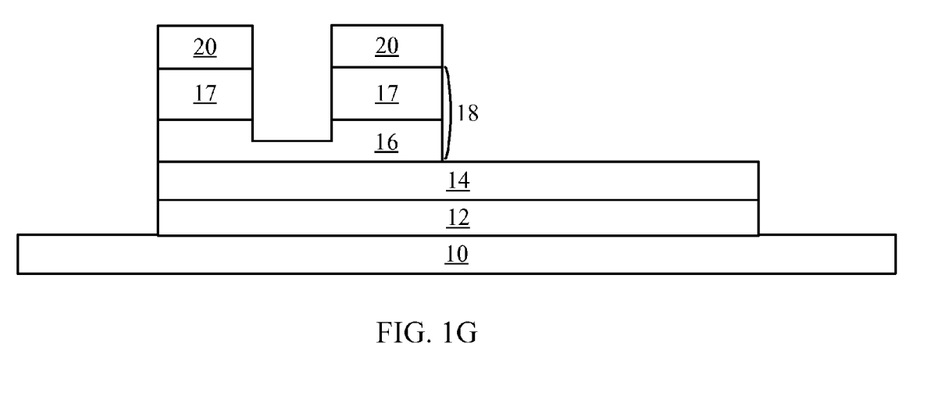

Referring to FIG. 1G, the third region D3 of the first patterned photoresist 22 shown in FIG. 1F is removed. The second metal layer 20 corresponding to the third region D3 forms the source electrode and the drain electrode of the thin film transistor respectively, and the semiconductor layer 18 located between the source electrode and the drain electrode serves as the channel of the thin film transistor. The gate electrode of the thin film transistor is formed by the first metal layer 12. In addition, the afore-mentioned etching processes may be implemented by a dry etching process or a wet etching process, depending on the material to be etched.

Figure 2A:
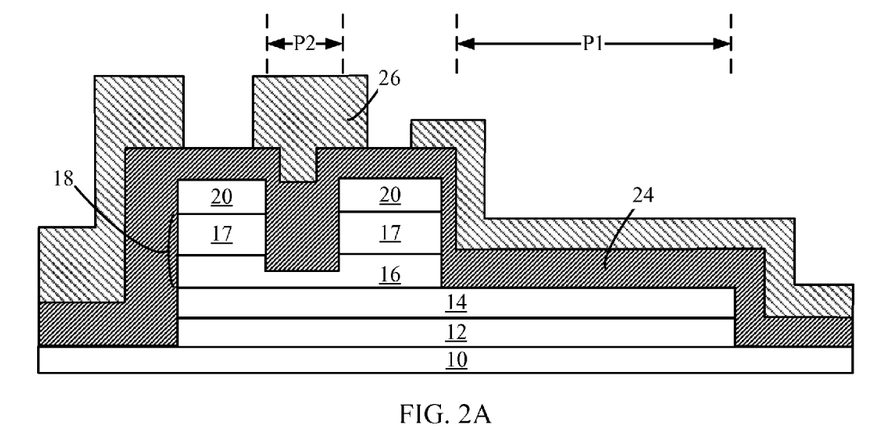
FIGS. 2A to 2E are schematic diagrams illustrating a thin film transistor array substrate manufacturing method utilizing a second mask fabrication step according to the present invention.

FIGS. 2A to 2E are schematic diagrams illustrating the thin film transistor array substrate manufacturing method utilizing a second mask fabrication step according to the present invention. Referring to FIG. 2A, at first, a protective layer 24 is formed to cover the source electrode and the drain electrode formed by the second metal layer 20, the channel located between the source electrode and the drain electrode, and the partially-exposed surface of the dielectric layer 14. The protective layer 24 can be a silicon nitride layer, a silicon oxide layer, or made of a silicon oxynitride dielectric material, and formed by means of chemical vapor deposition (CVD) or other thin film deposition techniques.

Referring to FIG. 2A, a second patterned photoresist 26 is provided on the protective layer 24 after the protective layer 24 is formed. The second patterned photoresist 26 may be formed by performing a second photolithographic step with another half-tone mask (not shown). As shown in FIG. 2A, the second patterned photoresist 26 exposes the protective layer 24 above the source electrode and the drain electrode formed by the second metal layer 20. Moreover, the second patterned photoresist 26 mainly includes a first portion P1 and a second portion P2. The first portion P1 substantially corresponds to the partially-exposed surface of the dielectric layer 14 covered by the protective layer 24 and the second portion P2 substantially corresponds to the channel between the source electrode and the drain electrode, wherein a thickness of the first portion P1 is smaller than that of the second portion P2. As described above, the second patterned photoresist 26 can be formed with a thickness varied in different portions by using the half-tone mask which has different light transmittance in different portions. In addition, other portions of the second patterned photoresist 26 may have a thickness greater than the thickness of the first portion P1 and this depends on the process demand.

Figure 2B:
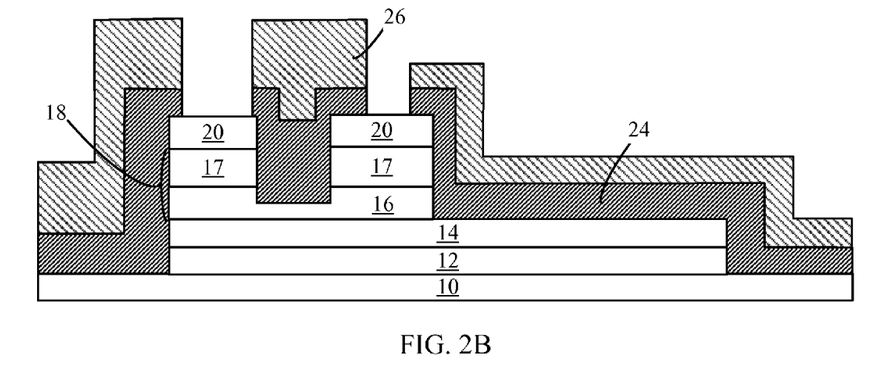

The second patterned photoresist 26 shown in FIG. 2A exposes the protective layer 24 above the source electrode and the drain electrode. Referring to FIG. 2B, an etching process is performed and the second patterned photoresist 26 shown in FIG. 2A serves as an etching mask to remove the proactive layer 24 located above the source electrode and the drain electrode so as to expose the surfaces of the source electrode and the drain electrode.

Figure 2C:
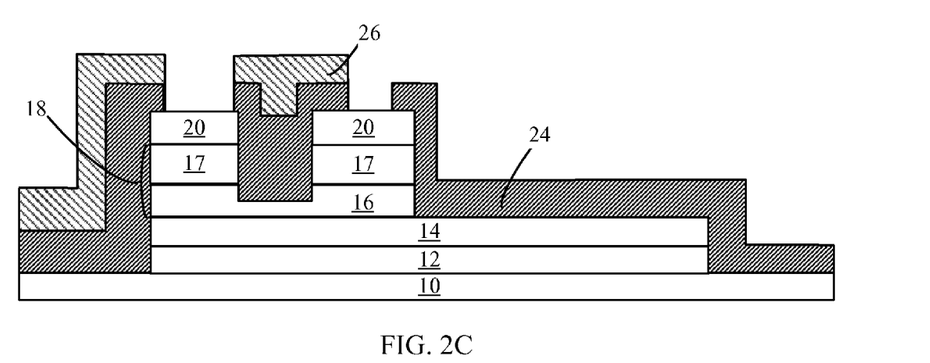

Referring to FIG. 2C, a third ashing process is conducted to reduce the thickness of the first portion P1 of the second patterned photoresist 26 until the first portion P1 is completely removed. In this procedure, a portion thicker than the first portion P1 is reduced in thickness but still maintain a certain thickness. For example, the thickness of the second portion P2 will be reduced. In the meanwhile, the surface of the protective layer 24 corresponding to the lower partially-exposed dielectric layer 14 or the surface of the protective layer 24 corresponding to the first portion P1 will be exposed.

Figure 2D:
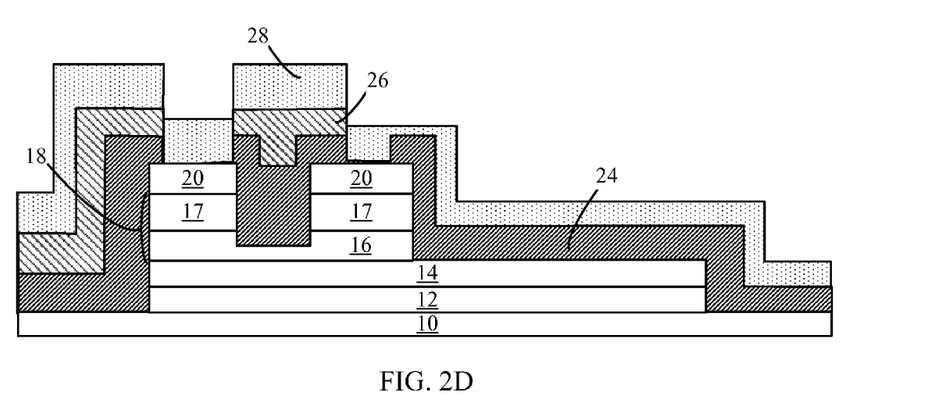

Referring to FIG. 2D, a transparent conductive layer 28 is formed by means of a sputtering process. The transparent conductive layer 28 covers the remaining second patterned photoresist 26, the aforesaid surface of the protective layer 24 corresponding to the lower partially-exposed dielectric layer 14, and the surfaces of the source electrode and the drain electrode. Also, the transparent conductive layer 28 directly contacts with the exposed surfaces of the source electrode and the drain electrode and is electrically connected to the source electrode and the drain electrode. In addition, the transparent conductive layer 28 can be an indium thin oxide (ITO) layer, an indium zinc oxide (IZO) layer, or a layer made of other transparent and conductive materials.

Figure 2E:
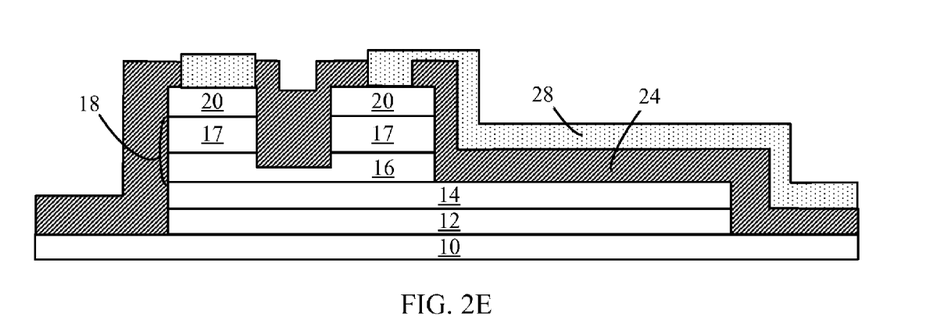

Referring to FIG. 2E, a lift-off process is carried out so as to remove the remaining second patterned photoresist 26 shown in FIG. 2D and remove a part of the transparent conductive layer 28 located above the second patterned photoresist 26 altogether. The transparent conductive layer 28 covering the aforesaid surface of the protective layer 24 corresponding to the lower partially-exposed dielectric layer 14 and covering the surfaces of the source electrode and the drain electrode is remained.

Above all, the present invention utilizes the first mask fabrication step to define the pattern of the source electrode and the drain electrode of the thin film transistor, and the partially-exposed dielectric layer, and utilizes the second mask fabrication step to define the arrangement of the transparent conductive layer. The thin film transistor array substrate manufacturing method of the present invention merely requires two steps of mask fabrication to accomplish the manufacture of thin film transistor array.

Compared to the conventional five steps of mask fabrication, the present invention is able to dramatically reduce the manufacturing cost of masks and simplify the whole manufacturing process. The present invention merely uses two steps of mask fabrication and the simplified process will significantly result in less time consumed in photoresist-coating, soft bake, hard bake, exposure, developing, etching, and photoresist removal as well as defect probability occurred in the mask fabrication steps, and therefore the present invention can improve the product yield rate.

Figure 3:
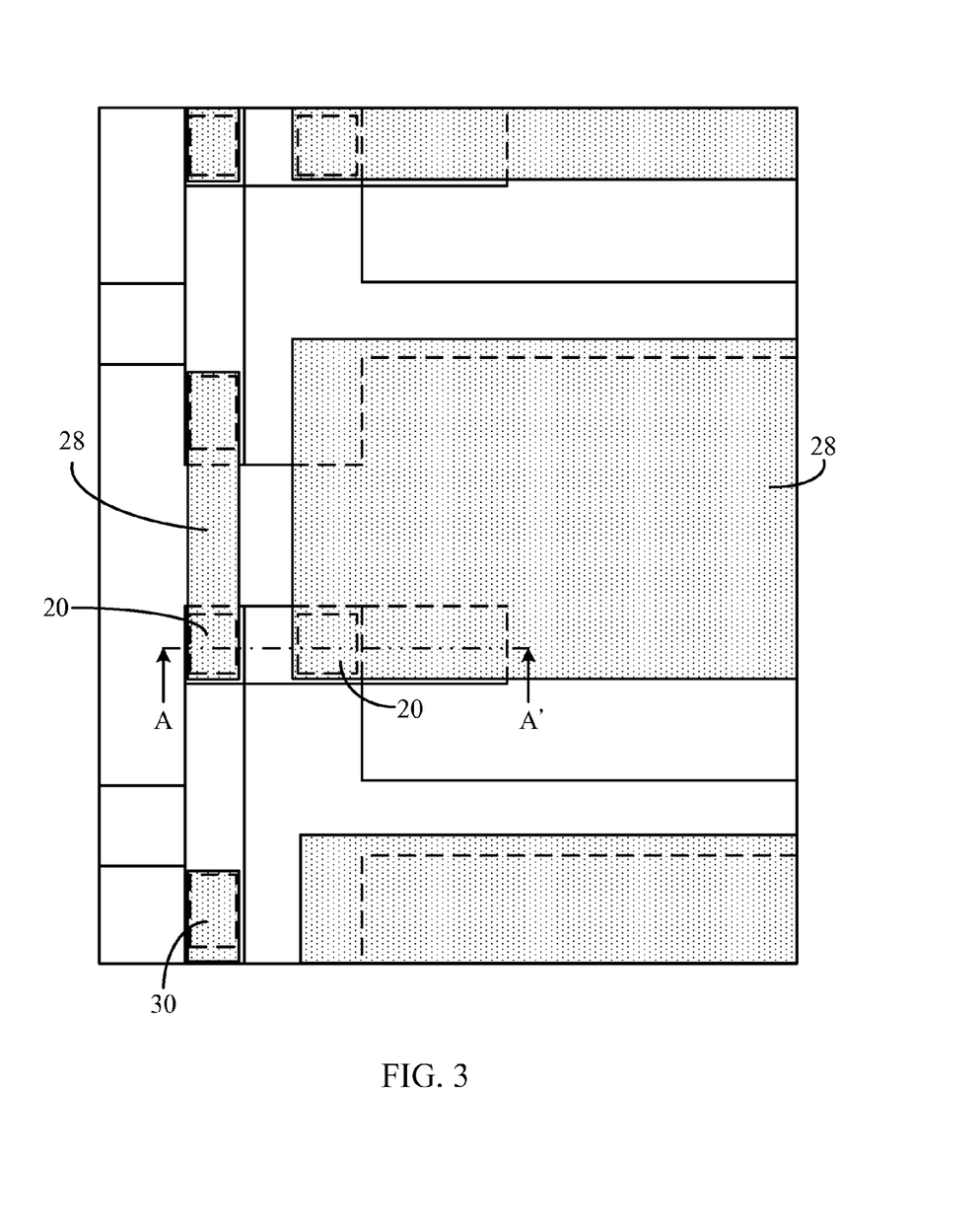
FIG. 3 is a schematic diagram showing a layout of a thin film transistor array substrate implemented according to the present invention.

FIG. 3 is a schematic diagram showing a layout of a thin film transistor array substrate implemented according to the present invention. FIG. 2E is a cross-sectional schematic diagram across A to A' of FIG. 3. Referring to FIG. 2E and FIG. 3, the thin film transistor array substrate of the present invention includes a substrate 10, a first metal layer 12, a dielectric layer 14, a semiconductor layer 18, a second metal layer 20, a protective layer 24, and a transparent conductive layer 28. The semiconductor layer 18 may include an amorphous silicon layer 16 and an ohmic contact layer 17. The first metal layer 12 is formed on the substrate 10 and a first electrode (e.g. a gate electrode) of the thin film transistor is formed by the first metal layer 12. The dielectric layer 14 is formed on the first metal layer 12 and the semiconductor layer 18 is formed on the dielectric layer 14. The second metal layer 20 is disposed on the ohmic contact layer 17 of the semiconductor layer 18. The second metal layer 20 has two portions which respectively form a second electrode and a third electrode (e.g. a source electrode and a drain electrode) of the thin film transistor. The ohmic contact layer 17 of the semiconductor layer 18 also has two portions corresponding to the source electrode and the drain electrode such that the semiconductor layer 18 forms a channel between the source electrode and the drain electrode.

Furthermore, the protective layer 24 covers the channel and exposes the source electrode and the drain electrode. The transparent conductive layer 28 is separately formed on the source electrode and the drain electrode respectively. The transparent conductive layer 28 extends out from one of the source electrode and the drain electrode along a surface of the protective layer 24 and the transparent conductive layer 28 extends from the other electrode to a metal contact 30 of another adjacent thin film transistor, as shown in FIG. 3.

Above all, in the thin film transistor array substrate of the present invention, the transparent conductive layer 28 not merely can serve as a pixel electrode of the thin film transistor, but also can be used as a conducting wire to electrically connect metal contacts or electrodes between two adjacent thin film transistors.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A method of manufacturing a thin film transistor array substrate, comprising steps of:
   providing a substrate and sequentially stacking a first metal layer, a dielectric layer, a semiconductor layer, and a second metal layer on the substrate;
   forming a first patterned photoresist on the second metal layer;

patterning the first metal layer, the dielectric layer, the semiconductor layer, and the second metal layer by using the first patterned photoresist to partially expose a surface of the dielectric layer, to form a source electrode and a drain electrode by the second metal layer, and to define a channel between the source electrode and the drain electrode;

forming a protective layer to cover the source electrode, the drain electrode, the channel, and the partially-exposed surface of the dielectric layer;

forming a second patterned photoresist on the protective layer;

patterning the first metal layer, the dielectric layer, the semiconductor layer, the second metal layer, and the protective layer by using the second patterned photoresist to expose surfaces of the source electrode and the drain electrode, and a surface of the protective layer corresponding to the lower partially-exposed dielectric layer;

forming a transparent conductive layer to cover the surfaces of the source electrode and the drain electrode, the surface of the protective layer corresponding to the lower partially-exposed dielectric layer, and the remaining second patterned photoresist; and removing the remaining second patterned photoresist and the transparent conductive layer covering the remaining second patterned photoresist altogether.

2. The method according to claim 1, wherein in the step of forming the first patterned photoresist, the first patterned photoresist comprises a first region corresponding to the partially-exposed surface of the dielectric layer, a second region corresponding to the channel, and a third region corresponding to the source electrode and the drain electrode, a thickness of the first region is smaller than that of the second region and a thickness of the second region is smaller than that of the third region.

3. The method according to claim 2, wherein the step of patterning by using the first patterned photoresist comprises sub-steps of:
conducting a first ashing process until the first region of the first patterned photoresist is removed; and
removing the second metal layer and the semiconductor layer corresponding to the first region to partially expose the surface of the dielectric layer.

4. The method according to claim 3, wherein the step of patterning by using the first patterned photoresist further comprises sub-steps of:
conducting a second ashing process until the second region of the first patterned photoresist is removed; and
removing the second metal layer corresponding to the second region to form the channel.

5. The method according to claim 1, wherein in the step of forming the second patterned photoresist, the second patterned photoresist comprises a first portion corresponding to the partially-exposed surface of the dielectric layer covered by the protective layer and a second portion corresponding to the channel, a thickness of the first portion is smaller than that of the second portion.

6. The method according to claim 5, wherein the step of patterning by using the second patterned photoresist further comprises sub-steps of:
conducting a third ashing process until the first portion of the second patterned photoresist is removed, to expose the surface of the protective layer corresponding to the lower partially-exposed dielectric layer.

7. The method according to claim 1, wherein the step of removing the remaining second patterned photoresist comprises a lift-off process.

8. The method according to claim 1, wherein a gate electrode is formed by the first metal layer.

* * * * *